(12) United States Patent
Sato et al.

(10) Patent No.: US 10,850,365 B2
(45) Date of Patent: Dec. 1, 2020

(54) POLISHING APPARATUS WITH A WASTE LIQUID RECEIVER

(71) Applicants: SHIN-ETSU HANDOTAI CO., LTD., Tokyo (JP); FUJIKOSHI MACHINERY CORP., Nagano (JP)

(72) Inventors: Michito Sato, Nishigo-mura (JP); Junichi Ueno, Shirakawa (JP); Kaoru Ishii, Shirakawa (JP); Yosuke Kanai, Nagano (JP); Yuya Nakanishi, Nagano (JP)

(73) Assignees: SHIN-ETSU HANDOTAI CO., LTD., Tokyo (JP); FUJIKOSHI MACHINERY CORP., Nagano (JP)

( * ) Notice: Subject to any disclaimer, the term of this patent is extended or adjusted under 35 U.S.C. 154(b) by 81 days.

(21) Appl. No.: 15/750,329

(22) PCT Filed: Aug. 3, 2016

(86) PCT No.: PCT/JP2016/003575
§ 371 (c)(1),
(2) Date: Feb. 5, 2018

(87) PCT Pub. No.: WO2017/033409
PCT Pub. Date: Mar. 2, 2017

(65) Prior Publication Data
US 2018/0222008 A1    Aug. 9, 2018

(30) Foreign Application Priority Data

Aug. 21, 2015 (JP) .................. 2015-163908

(51) Int. Cl.
*B24B 37/00* (2012.01)
*B24B 37/12* (2012.01)
(Continued)

(52) U.S. Cl.
CPC ............ *B24B 37/107* (2013.01); *B24B 37/00* (2013.01); *B24B 37/10* (2013.01); *B24B 37/12* (2013.01);
(Continued)

(58) Field of Classification Search
CPC ..... B24B 37/10; B24B 37/102; B24B 37/105; B24B 37/107; B24B 57/00; B24B 57/02;
(Continued)

(56) References Cited

U.S. PATENT DOCUMENTS 3,500,591 A * 3/1970 Keith .................. B24B 9/12
451/41
4,869,779 A * 9/1989 Acheson ............... B24B 7/228
156/345.12

(Continued)

FOREIGN PATENT DOCUMENTS

CN    204094614 U    1/2015
GB    1261131 A    1/1972
(Continued)

OTHER PUBLICATIONS

Apr. 24, 2019 Office Action issued in Chinese Patent Application No. 201680047958.3.
(Continued)

*Primary Examiner* — Eileen P Morgan
(74) *Attorney, Agent, or Firm* — Oliff PLC

(57) ABSTRACT

A polishing apparatus including: a turntable with an attached polishing pad; a polishing head that holds a wafer; a tank that stores a polishing agent; a polishing agent supply mechanism which supplies the stored polishing agent to the polishing pad; a waste liquid receiver which collects the polishing agent flowing from the turntable; and a circulation mechanism which is connected to the waste liquid receiver and supplies the collected polishing agent to the tank, the (Continued)

polishing agent is supplied to the polishing pad from the tank with the polishing agent supply mechanism, the used polishing agent which flows from the turntable is collected by the waste liquid receiver, a surface of the wafer held by the polishing head is rubbed against the pad to polish it while supplying the collected polishing agent to the tank to circulate the polishing agent, and the waste liquid receiver is fixed to the turntable and the waste liquid receiver having a bottom plate and a removable side plate.

2 Claims, 5 Drawing Sheets

(51) Int. Cl.

| | | |
|---|---|---|
| *B24B 37/10* | (2012.01) | |
| *B24B 37/20* | (2012.01) | |
| *B24B 37/34* | (2012.01) | |
| *B24B 57/00* | (2006.01) | |
| *B24B 57/02* | (2006.01) | |
| *H01L 21/304* | (2006.01) | |

(52) U.S. Cl.
CPC .............. *B24B 37/20* (2013.01); *B24B 37/34* (2013.01); *B24B 57/00* (2013.01); *B24B 57/02* (2013.01); *H01L 21/304* (2013.01); *Y02P 70/10* (2015.11)

(58) Field of Classification Search
CPC ......... B24B 37/12; B24B 37/20; B24B 37/00; B24B 37/34; H01L 21/304
USPC ...................... 451/36, 41, 60, 285, 287, 446
See application file for complete search history.

(56) References Cited

U.S. PATENT DOCUMENTS

| | | | | | |
|---|---|---|---|---|---|
| 5,647,989 | A | * | 7/1997 | Hayashi | B01D 61/14 210/641 |
| 5,658,185 | A | * | 8/1997 | Morgan, III | B24B 37/16 438/693 |
| 5,664,990 | A | * | 9/1997 | Adams | B24B 37/04 451/60 |
| 5,791,970 | A | * | 8/1998 | Yueh | B24B 37/04 451/446 |
| 6,106,375 | A | * | 8/2000 | Furusawa | B24B 55/02 210/539 |
| 6,126,531 | A | * | 10/2000 | Iida | B24B 37/04 451/447 |
| 6,159,082 | A | * | 12/2000 | Sugiyama | B24B 37/04 451/285 |
| 6,413,151 | B2 | * | 7/2002 | Mizuno | B24B 37/04 451/285 |
| 6,558,238 | B1 | * | 5/2003 | Crevasse | B24B 37/04 451/287 |
| 6,810,888 | B2 | * | 11/2004 | Tsuchiya | H01L 21/6715 134/104.2 |
| 9,339,914 | B2 | * | 5/2016 | Yavelberg | B24B 37/34 |
| 10,343,248 | B2 | * | 7/2019 | Miyamoto | B24B 7/228 |
| 10,468,277 | B2 | * | 11/2019 | Schoeb | H01L 21/6708 |
| 2003/0164356 | A1 | * | 9/2003 | Tanaka | B24B 37/04 216/89 |
| 2004/0050491 | A1 | * | 3/2004 | Miya | H01L 21/68785 156/345.11 |
| 2009/0084409 | A1 | * | 4/2009 | Okura | B08B 3/02 134/21 |
| 2011/0240220 | A1 | * | 10/2011 | Schoeb | H01L 21/67051 156/345.14 |
| 2014/0069890 | A1 | | 3/2014 | Yavelberg | |

FOREIGN PATENT DOCUMENTS

| | | |
|---|---|---|
| JP | H07-32263 A | 2/1995 |
| JP | H10-324865 A | 12/1998 |
| JP | H11-254298 A | 9/1999 |
| JP | H11-277434 A | 10/1999 |
| JP | 2009-248269 A | 10/2009 |
| TW | 383257 B | 3/2000 |

OTHER PUBLICATIONS

May 1, 2018 Office Action issued in Japanese Patent Application No. 2015-163908.
Feb. 27, 2018 International Preliminary Report on Patentability issued in International Patent Applicaion No. PCT/JP2016/003575.
Dec. 5, 2018 Office Action issued in Chinese Patent Application No. 201680047958.3.
Sep. 13, 2016 Search Report issued in International Patent Applicaion No. PCT/JP2016/003575.
Feb. 21, 2020 Office Action issued in Taiwanese Patent Application No. 105125238.
Jul. 30, 2020 Office Action issued in Taiwanese Patent Application No. 105125238.

\* cited by examiner (A)

(B)

Related Art ially, Patent Literature 2 discloses a
POLISHING APPARATUS WITH A WASTE LIQUID RECEIVER

TECHNICAL FIELD

The present invention relates to a polishing apparatus.

BACKGROUND ART

To polish a semiconductor wafer as typified by a silicon wafer, a method for polishing both surfaces at the same time or a method for polishing one surface is used.

In the method for polishing one surface of a wafer, as shown in FIG. 8, it is possible to use a polishing apparatus 101 constituted of a turntable 103 having a polishing pad 102 attached thereto, a polishing agent supply mechanism 106, polishing heads 104, and others. In this polishing apparatus 101, wafers W are held by the polishing heads 104 respectively, a polishing agent is supplied onto the polishing pad 102 from the polishing agent supply mechanism 106, and the turntable 103 and the polishing heads 104 are rotated respectively so that surfaces of the wafers W are rubbed against the polishing pad 102, thereby performing the polishing. Further, the polishing apparatus 101 also includes a mechanism which oscillates the turntable 103. Consequently, transference of small irregularities on the polishing pad 102 or a groove pattern can be suppressed.

Furthermore, semiconductor wafers are often polished on multiple stages while changing a type of the polishing pad or a type of the polishing agent. For example, a polishing apparatus having two turntables or three turntables which is called an index system is often used. FIG. 9 shows a polishing apparatus having three turntables. A polishing apparatus 201 shown in FIG. 9 has two polishing heads 204 on respective polishing shafts on each turntable 203. Thus, two semiconductor wafers can be simultaneously polished per batch, and hence productivity is excellent.

Further, in general, the polishing apparatus also includes a mechanism which performs brushing or dressing (which will be referred to as a dressing mechanism hereinafter) to suppress clogging of the polishing pad. The dressing mechanism can perform dressing or the like to the polishing pad at the time of start-up of the polishing pad or during an interval of the polishing.

A polishing agent provided by mixing colloidal silica or fumed silica in an alkaline solution is used to polish wafers, and the polishing agent, a dressing agent, or a solution such as pure water is used for dressing or brushing. Furthermore, for the purpose of protecting wafer surfaces after end of polishing, a hydrophilic agent which hydrophilizes surfaces of wafers is added to the polishing agent, or the polishing agent is changed to the hydrophilic agent at the end of polishing to hydrophilize surfaces of wafers.

Moreover, the polishing agent is circulated and recycled or it is flowed and used only once in accordance with various purposes. In case of recirculating and recycling the polishing agent, polishing conditions with a high cooling effect can be set by increasing a polishing agent supply flow volume, but there is a demerit that concentration of the polishing agent is apt to fluctuate due to the circulation. In case of flowing and using the polishing agent only once, increasing the polishing agent supply flow volume is difficult due to its cost, but the concentration is fixed, and hence there is a merit that quality is easily stabilized.

A waste liquid receiver to collect the used polishing agent is installed in the polishing apparatus. To collect slurry which scatters due to rotation of the turntable, as disclosed in Patent Literature 1, the waste liquid receiver is larger than a turntable size. Additionally, Patent Literature 2 discloses a polishing apparatus which is designed to collect a scattered part of the slurry. However, in such a polishing apparatus as disclosed in Patent Literature 2, since the turntable is likewise oscillated in a horizontal direction by an oscillation mechanism, a waste liquid receiver which is equal to or larger than an oscillation width is required.

As described above, in the polishing apparatus, a plurality of types of solutions such as polishing agents are used. For example, at the time of polishing wafers, the polishing agent and the hydrophilic agent are used. Further, for example, at the time of dressing, the polishing agent, and a dressing agent of exclusive use, or pure water are used. Thus, the polishing agent, the hydrophilic agent, the dressing agent, and the pure water are supplied onto the polishing pad. There occurs no problem when all these solutions are flowed and used only once, but these different solutions must be separately collected in case of recycling one of them. Thus, a switching mechanism (which will be also referred to as a separator hereinafter) is provided at an end of the waste liquid receiver, and a collection line is switched in accordance with each solution to be collected, thereby collecting the solution.

FIG. 10 shows an example of a cross-sectional view of the separator. In the separator 300 shown in FIG. 10, an upper piping 301 or a lower box 302 can move in a left-and-right direction by an air cylinder or the like. The piping 301 is connected to a collection line on a turntable side, and a collected solution flows into the waste liquid receiver from here. In this example, a flow of the solution is switched to the collection line on a right side of the box 302 at the time of collecting the polishing agent or switched to a drainage line on a left side of the box 302 at the time of draining. It is to be noted that FIG. 10 shows an example where two types of lines, i.e., the polishing agent collection line and the drainage line are provided, and it is also possible to provide two types or more of collection lines, e.g., the polishing agent collection line, a dressing agent collection line, and the drainage line.

CITATION LIST

Patent Literatures

Patent Literature 1: Japanese Unexamined Patent Application Publication No. Hei 10-324865
Patent Literature 2: Japanese Unexamined Patent Application Publication No. Hei 11-277434

DISCLOSURE OF INVENTION

Problem to be Solved by the Invention

As described above, in case of using a plurality of solutions, immediately after changing a type of the solution which is to be supplied to the polishing pad, the plurality of solutions are mixed in the waste liquid receiver. When the mixed solution is collected and reused, a polishing rate or wafer quality fluctuates. Thus, to avoid the solutions from being mixed, after changing the type of the solution, the collection line and the drainage line must be switched soon by using the separator. However, since a conventional waste liquid receiver has a large area, a mixing amount increases, which results in a problem that collection efficiency is degraded. When the collection efficiency is poor, an adjustment cost for the polishing agent to be reused rises.

To suppress mixture of the polishing solutions and increase the collection efficiency, a countermeasure, e.g., sharpening an angle of the waste liquid receiver, or shortening a distance from the waste liquid receiver to the separator has been taken but, when wafers as polishing targets become large, the turntable size also increases, and the area of the waste liquid receiver expands, and hence an effect of the countermeasure is limited.

Furthermore, since the turntable oscillates, the waste liquid receiver is placed on the lower surface of the turntable depending on a position of the turntable, when an angle of the waste liquid receiver is sharpened in a limited space, there occurs a problem that maintenance, e.g., cleaning becomes difficult when a wafer cracks.

In view of the above-described problem, it is an object of the present invention to provide a polishing apparatus which can suppress mixture with other solutions at the time of collecting the polishing agent, can suppress degradation of the collection efficiency, and can be easily maintained.

Means for Solving Problem

To achieve the object, the present invention provides a polishing apparatus including: a turntable which has a polishing pad attached thereto; a polishing head configured to hold a wafer; a tank configured to store a polishing agent; a polishing agent supply mechanism which supplies the polishing agent stored in the tank to the polishing pad; a waste liquid receiver which collects the polishing agent flowing down from an upper side of the turntable; and a circulation mechanism which is connected to the waste liquid receiver and supplies the polishing agent collected by the waste liquid receiver to the tank, the polishing agent being supplied to the polishing pad from the tank by the polishing agent supply mechanism, the used polishing agent which flows down from the upper side of the turntable being collected by the waste liquid receiver, a surface of the wafer held by the polishing head being rubbed against the polishing pad so that it is polished while supplying the collected polishing agent to the tank to circulate the polishing agent, the polishing apparatus being characterized in that the waste liquid receiver is fixed to the turntable.

As described above, in the polishing apparatus having the waste liquid receiver fixed to the turntable, since the waste liquid receiver oscillates together with the turntable, the waste liquid receiver does not have to be increased in size by an oscillation width as different from conventional examples. Thus, an area of the waste liquid receiver can be reduced, mixture with other solutions can be suppressed at the time of collecting the polishing agent, and degradation of the collection efficiency of the polishing agent can be suppressed. Moreover, since a relative position of the waste liquid receiver and the turntable does not change even though the turntable oscillates, a maintenance operation, e.g., cleaning of the waste liquid receiver does not become difficult depending on a position of the turntable. Additionally, the waste liquid receiver can be removed, replacement at the time of breakage or the like can be facilitated.

At this time, it is preferable for the waste liquid receiver to be formed into a ring-like shape which surrounds a side surface of the turntable.

As described above, when the waste liquid receiver is formed in the ring-like shape which surrounds the side surface of the turntable, the waste liquid flowing down from an entire circumference of an upper surface of the turntable can be efficiently collected in a smaller area.

Further, at this time, it is preferable for the waste liquid receiver to be formed of a bottom plate and a side plate, and for the side plate to be removable.

With such a structure, since the side plate can be removed to enable cleaning work at the time of cleaning, the polishing apparatus which is further superior in maintenance properties can be provided.

Effect of the Invention

The polishing apparatus according to the present invention can suppress mixture with other solutions and inhibit degradation of the collection efficiency at the time of collecting the polishing agent to be reused. Further, maintenance work such as cleaning the waste liquid receiver does not become difficult depending on a position of the turntable.

BEST MODE(S) FOR CARRYING OUT THE INVENTION

Although an embodiment of the present invention will now be described hereinafter, the present invention is not restricted thereto.

As described above, in a conventional polishing apparatus, a waste liquid receiver is installed below a turntable, thus a size of the waste liquid receiver must be greatly increased in accordance with an oscillation width of the turntable. Consequently, since an area of the waste liquid receiver is large, a mixing amount of solutions increase, which results in a problem that collection efficiency is degraded. Further, the waste liquid receiver is placed on, e.g., a lower side of the turntable depending on a position of the turntable, and hence there is also a problem that maintenance, e.g., cleaning when a wafer cracks becomes difficult.

Thus, the present inventors repeatedly conducted the earnest examinations to solve such a problem. Consequently, they have found out that, when the waste liquid receiver is fixed to the turntable, the size of the waste liquid receiver does not have to be increased beyond necessity, mixture or dilution of a dressing agent and pure water can be suppressed at the time of collecting a polishing agent, quality of the polishing agent can be stabilized, a consumption amount of the polishing agent can be reduced, and excellent maintenance properties of the apparatus can be provided, thereby bringing the present invention to completion.

Figure 1:
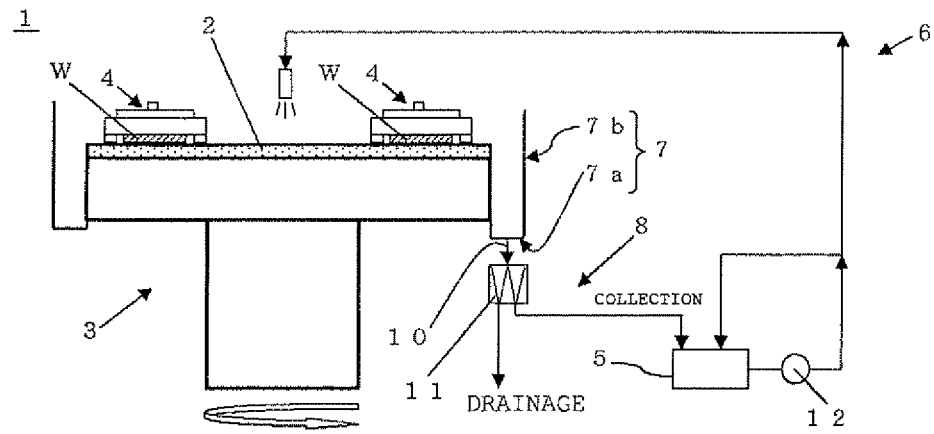
FIG. 1 is a schematic view showing an example of a polishing apparatus according to the present invention.

A polishing apparatus according to the present invention will now be described hereinafter with reference to FIGS. 1 to 3. As shown in FIG. 1, the polishing apparatus 1 according to the present invention includes a turntable 3 having a polishing pad 2 attached thereto, polishing heads 4 configured to hold wafers W respectively, a tank 5 configured to store a polishing agent, a polishing agent supply mechanism 6 which supplies the polishing agent stored in the tank 5 to the polishing pad 2, a waste liquid receiver 7 which collects the polishing agent flowing down from an upper side of the turntable 3, and a circulation mechanism 8 which is connected to the waste liquid receiver 7 and supplies the polishing agent collected by the waste liquid receiver 7 into the tank 5. It is to be noted that FIG. 1 shows a mode where the two polishing heads 4 are provided on the one turntable, but the polishing apparatus according to the present invention is not restricted thereto. For example, one, three, or more polishing heads may be provided on the one turntable. Further, the number of the turntable is not restricted in particular, and the plurality of turntables may be provided.

Here, in the polishing apparatus 1 according to the present invention, the waste liquid receiver 7 is fixed to the turntable 3. Consequently, since an area of the waste liquid receiver can be reduced irrespective of presence/absence of oscillation of the turntable or a size of the turntable, mixture of polishing solutions can be suppressed, and collection efficiency can be improved. Furthermore, since a relative position to the turntable does not change due to oscillation of the turntable or the like, a maintenance operation such as cleaning of the waste liquid receiver does not become difficult depending on a position of the turntable. Thus, a time required for the maintenance operation can be shortened, and an apparatus stop time can be decreased. It is to be noted that, to fix the waste liquid receiver 7 to the turntable 3, for example, as shown in (B) in FIG. 2 and FIG. 3, a stay can be disposed to a lower portion of the turntable 3 so that the waste liquid receiver 7 can be fixed to the turntable 3.

Figure 2:
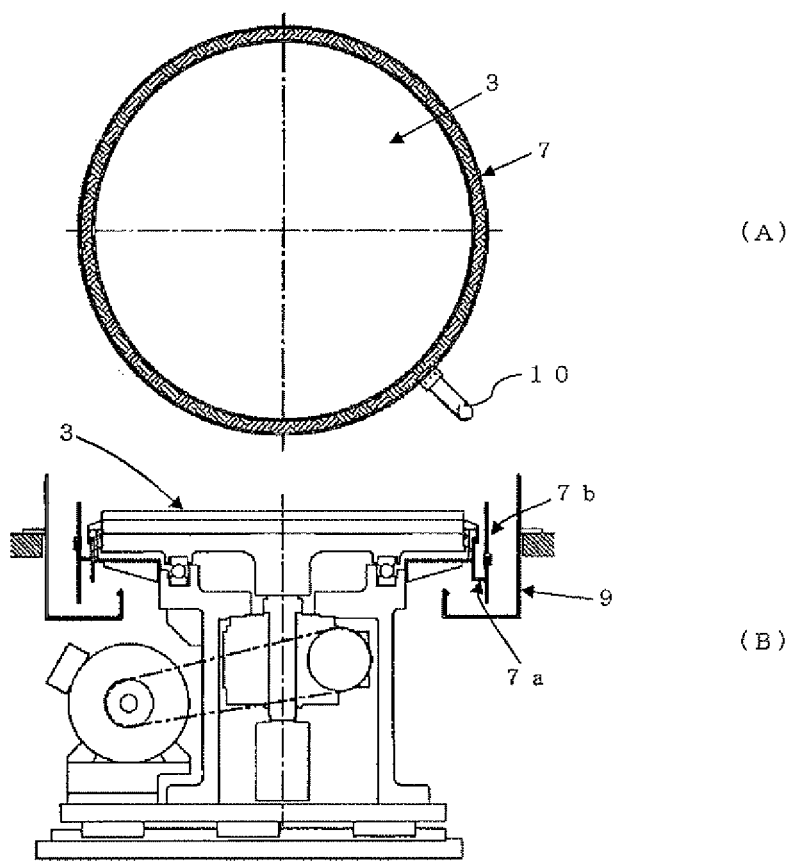
FIG. 2 is a top view and a side elevation showing an example of a peripheral portion of a turntable of the polishing apparatus according to the present invention.

Furthermore, as shown in (A) in FIG. 2, the waste liquid receiver 7 can be formed into a ring-like shape surrounding a side surface of the turntable 3. With such a structure, a waste liquid flowing down from an entire circumference of an upper surface of the turntable 3 can be efficiency collected in a smaller area.

Figure 3:
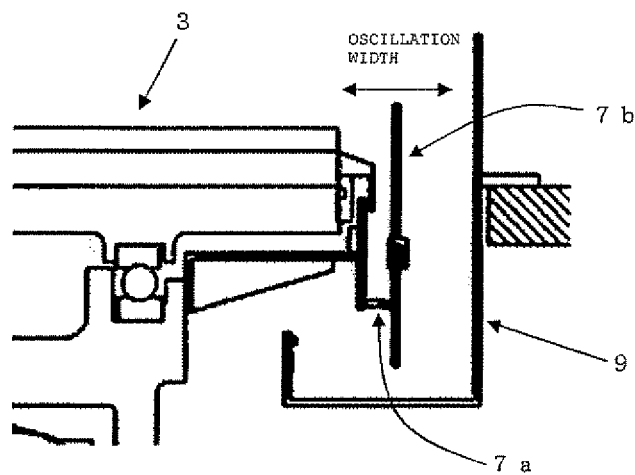
FIG. 3 is an enlarged view of a peripheral portion of a side surface of the turntable of the polishing apparatus according to the present invention.

Moreover, as shown in FIG. 1, (B) in FIG. 2, and FIG. 3, the waste liquid receiver 7 may be constituted of a bottom plate 7*a* and a side plate 7*b*, and the side plate 7*b* may be removable. With such a structure, at the time of cleaning, the side plate can be removed to perform the cleaning operation, and hence more excellent workability can be provided at the time of maintenance. It is to be noted that the waste liquid receiver 7 is preferably made of a synthetic resin such as vinyl chloride.

Additionally, in the polishing apparatus shown in FIG. 2 and FIG. 3, a waste liquid tray 9 is arranged on an outer side of the waste liquid receiver 7. This waste liquid tray 9 can prevent water from entering a machine room of the turntable 3 when the turntable 3 is cleaned by using a hand shower or the like in a state where the side plate 7*b* of the waste liquid receiver 7 has been removed at the time of maintenance. It is to be noted that the waste liquid tray 9 is preferably made of a synthetic resin such as vinyl chloride.

In such a polishing apparatus 1, the polishing agent is supplied to the polishing pad 2 from the tank 5 by a pump 12 or the like attached to the polishing agent supply mechanism 6, and the used polishing agent flowing down from the upper side of the turntable 3 is collected by the waste liquid receiver 7.

Figure 10:
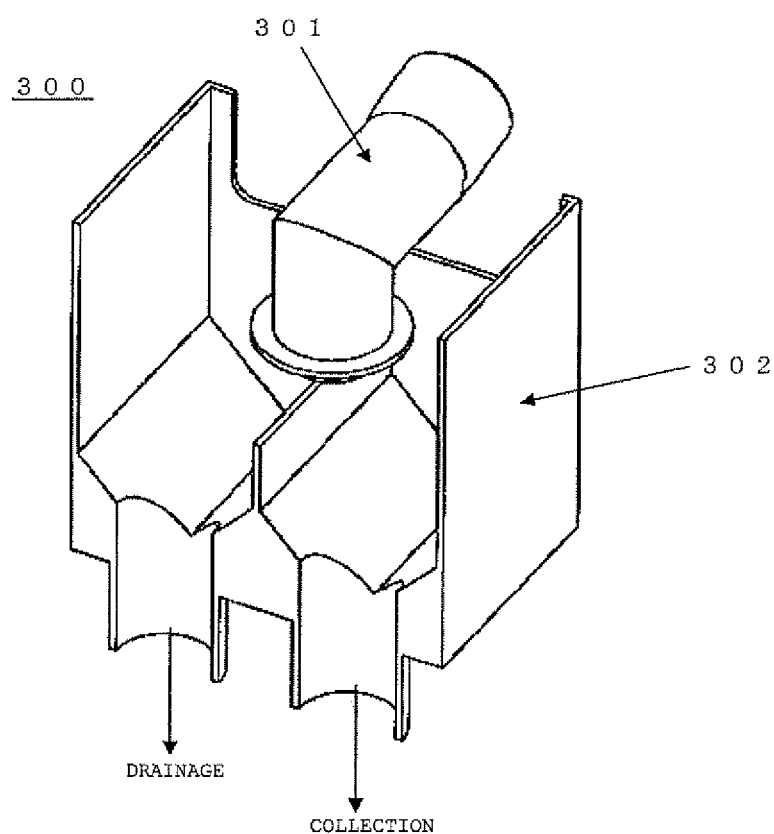
FIG. 10 is a cross-sectional view showing an example of a separator.

The used polishing agent collected by the waste liquid receiver 7 is supplied into the tank 5 by the circulation mechanism 8 constituted of a waste liquid collection line 10, a separator 11, and the like. It is to be noted that a collection line and a drainage line can be switched by the separator 11. The separator 11 which is the same as, e.g., such a conventional separator as shown in FIG. 10 can be used.

Further, the polishing agent collected in the tank 5 is supplied to the polishing pad 2. A surface of each wafer W held by each polishing head 4 is rubbed against the polishing pad 2 to perform polishing while circulating the polishing agent in this manner.

When the polishing is performed by using the polishing apparats 1 according to the present invention, even if the polishing agent is circulated and reused, the polishing agent is hard to be mixed with other solutions. Thus, dilution of the polishing agent hardly occurs, and a fluctuation in polishing rate can be suppressed. Furthermore, an amount of the polishing agent, which cannot be reused when it is mixed with other solutions, can be reduced, and hence a cost required for the polishing agent can be decreased.

EXAMPLES

The present invention will now be more specifically described hereinafter with reference to an example and a comparative example, but the present invention is not restricted to the example.

Example

Silicon wafers each having a diameter of 300 mm were polished by using a polishing apparatus according to the present invention while circulating and reusing a polishing agent. Moreover, as the polishing apparatus, a polishing apparatus of an index system which has three turntables and has two polishing heads per turntable was adopted. A diameter of each turntable was 800 mm.

In Example, as shown in FIG. 3, a stay was disposed to a lower portion of each turntable 3, and a waste liquid receiver 7 made of vinyl chloride was fixed to each turntable 3. Since the waste liquid receiver oscillates together with the turntable, an area of the waste liquid receiver could be reduced to a size with which overflow does not occur which a polishing flow volume is maximum. Consequently, an area of the waste liquid receiver (a plane occupancy area) became 68.3 mm$^2$, thus the area was reduced to approximately ⅕ of that in a later-described comparative example. It is to be noted that, in Example, to suppress mixture of polishing liquids and improve collection efficiency, the inside of the waste liquid receiver was inclined.

To confirm an effect provided by reducing the area of the waste liquid receiver, 10 batches of wafer polishing were continuously performed under the following separator switching conditions 1 and 2, respectively. It is to be noted that, in this polishing, a process from polishing of the wafers to polishing pad brushing using pure water was determined as one batch, and this was repeated for 10 times.

(Condition 1)

Figure 4:
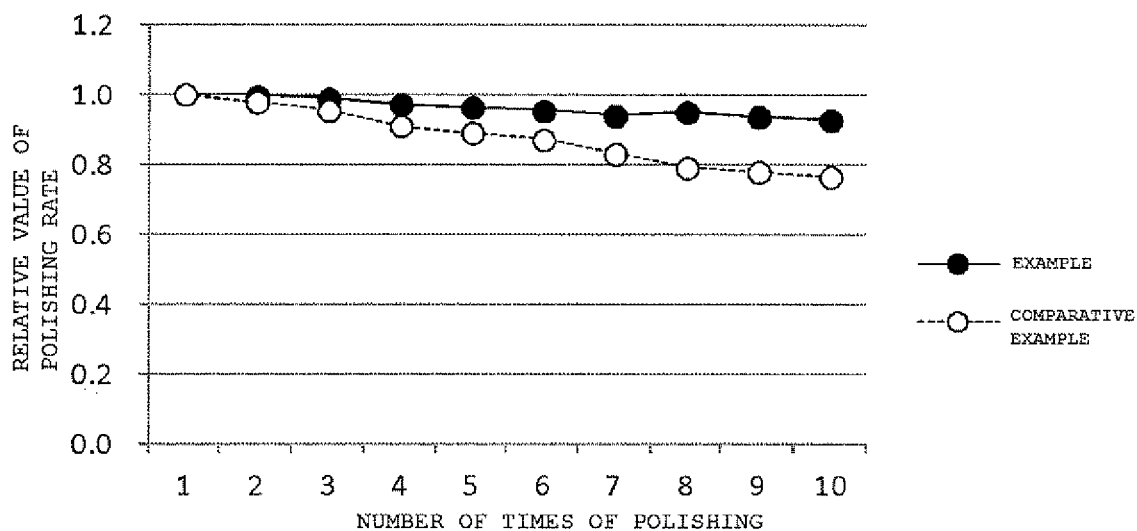
FIG. 4 is a graph showing polishing rates according to Example and Comparative Example.

Under Condition 1, line switching was performed by a separator at timing which does not reduce a polishing agent amount in a tank. Under this condition, the pure water is mixed with the polishing agent, the polishing agent is diluted, and a polishing rate is apt to decrease. Fluctuations in polishing rate were checked, and a reduction in polishing rate was suppressed to 7% in Example as shown in FIG. 4. It is to be noted that, in FIG. 4, the polishing rate of each batch is a relative value to a polishing rate of the first batch.

(Condition 2)

Figure 5:
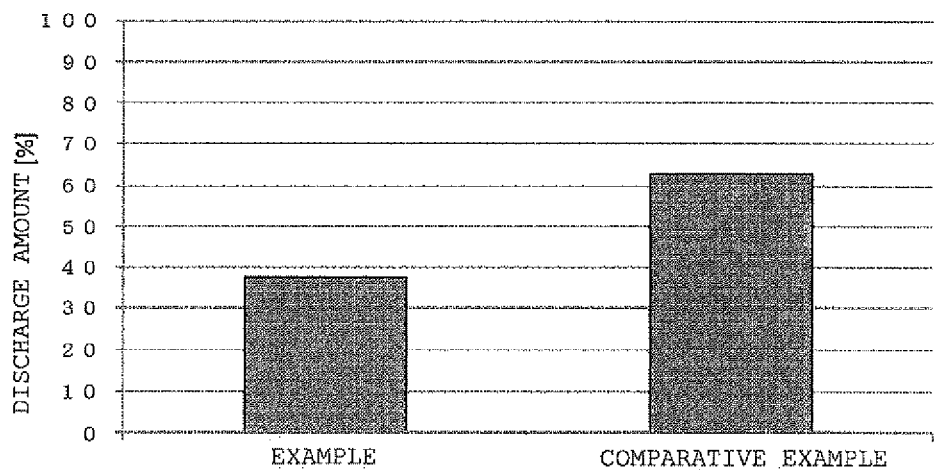
FIG. 5 is a graph showing drainage volumes of a polishing agent according to Example and Comparative Example.

Additionally, under Condition 2, switching using the separator was performed at timing which can prevent the pure water from being mixed with the polishing agent. Under this condition, a discharge amount of the polishing agent is apt to increase. The discharge amount was calculated from a residual amount in a slurry tank after continuously performing polishing for the 10 batches. Consequently, as shown in FIG. 5, the discharge amount of the polishing agent in Example was 38%.

Comparative Example

Figure 6:
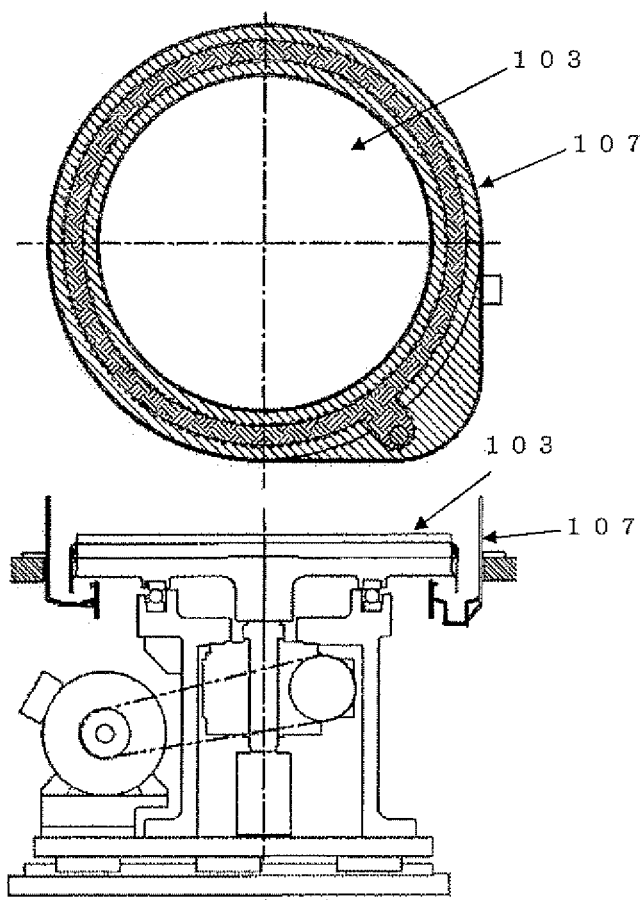
FIG. 6 is a top view and a side elevation showing an outline of a peripheral portion of a turntable of a polishing apparatus used in Comparative Example.
Figure 7:
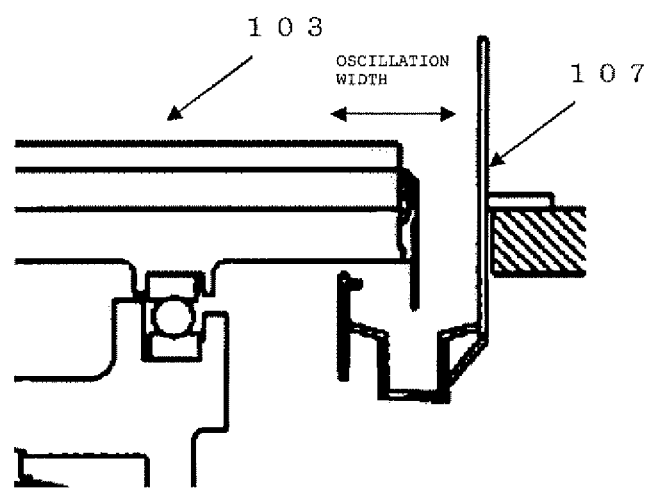
FIG. 7 is an enlarged view of a peripheral portion of a side surface of the turntable of the polishing apparatus used in Comparative Example.
Figure 8:
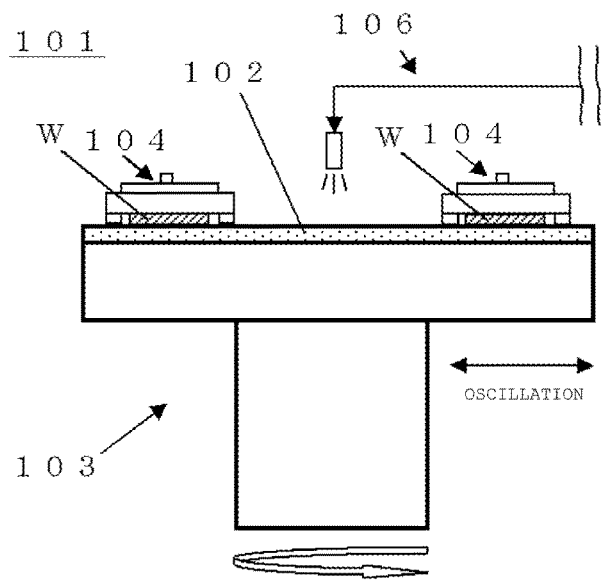
FIG. 8 is a schematic view showing an example of a conventional single-side polishing apparatus.
Figure 9:
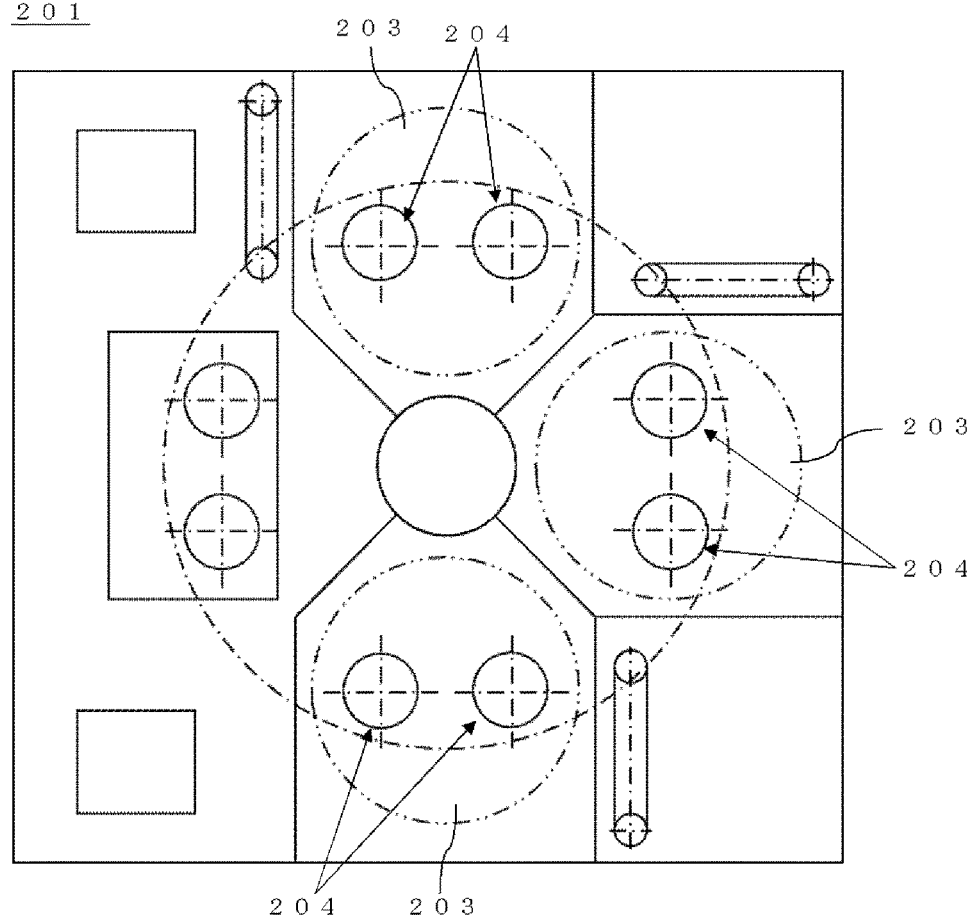
FIG. 9 is a schematic view showing an example of a conventional single-side polishing apparatus of an index system.

A polishing rate and a discharge amount of the polishing agent were evaluated like Example under the same condition as that of Example except that a conventional polishing apparatus whose waste liquid receiver was not fixed to a turntable was used. In the polishing apparatus adopted in Comparative Example, as shown in FIGS. 6 and 7, a waste liquid receiver 107 is not fixed to each turntable 103, and hence a relative position of the waste liquid receiver 107 and the turntable 103 changes due to oscillation of the turntable 103. Thus, to collect the polishing agent irrespective of a turntable position, an area of the waste liquid receiver must be increased. As a result of considering a turntable size and an oscillation width in Comparative Example, an area of the waste liquid receiver (a plane occupancy area) became 307.3 mm$^2$. The area was not able to be reduced any further due to an oscillation width. It is to be noted that, like Example, to suppress mixture of the polishing liquids and improve collection efficiency, the inside of the waste liquid receiver is inclined.

As a result of continuously performing polishing for the 10 batches under the Condition 1, the polishing rate was reduced 24% in Comparative Example. As described above, the polishing rate was greatly lowered as compared with Example.

As a result of continuously performing polishing for the 10 batches under the Condition 2, 63% of the polishing agent was discharged in Comparative Example. As described above, the discharge amount was greatly increased as compared with Example.

It is to be noted that the present invention is not restricted to the embodiment. The embodiment is an illustrative example, and any example which has substantially the same structure and exerts the same functions and effects as the technical concept described in claims of the present invention is included in the technical scope of the present invention.

The invention claimed is:

1. A polishing apparatus comprising:
   a turntable which has a polishing pad attached thereto;
   a polishing head configured to hold a wafer;
   a tank configured to store a polishing agent;
   a polishing agent supply mechanism configured to supply the polishing agent stored in the tank to the polishing pad;
   a waste liquid receiver configured to collect the polishing agent supplied to the polishing pad, used during polishing, and flowing down from an upper side of the turntable; and
   a circulation mechanism which is connected to the waste liquid receiver and is configured to supply the polishing agent collected by the waste liquid receiver to the tank,
   wherein the polishing apparatus is configured such that, when a surface of the wafer held by the polishing head is rubbed against the polishing pad for polishing, the collected polishing agent from the waste liquid receiver is supplied to the tank to circulate the polishing agent, and
   wherein the waste liquid receiver is fixed to a side surface of the turntable and formed of a bottom plate and a side plate, and the side plate is removable from the bottom plate.

2. The polishing apparatus according to claim 1, wherein the waste liquid receiver is formed into a ring shape which surrounds the side surface of the turntable.

* * * * *